(12) United States Patent
Yamada et al.

(10) Patent No.: US 11,761,991 B2
(45) Date of Patent: Sep. 19, 2023

(54) CURRENT DETECTION CIRCUIT, CIRCUIT DEVICE, AND SOLENOID CONTROL DEVICE

(71) Applicant: Seiko Epson Corporation, Tokyo (JP)

(72) Inventors: Toshimichi Yamada, Chino (JP); Kei Ishimaru, Chino (JP)

(73) Assignee: SEIKO EPSON CORPORATION

( * ) Notice: Subject to any disclaimer, the term of this patent is extended or adjusted under 35 U.S.C. 154(b) by 0 days.

(21) Appl. No.: 17/706,924

(22) Filed: Mar. 29, 2022

(65) Prior Publication Data

US 2022/0317162 A1 Oct. 6, 2022

(30) Foreign Application Priority Data

Mar. 30, 2021 (JP) .............................. JP2021-056395

(51) Int. Cl.
*G01R 19/00* (2006.01)
*G01R 1/20* (2006.01)

(52) U.S. Cl.
CPC ......... *G01R 19/0023* (2013.01); *G01R 1/203* (2013.01)

(58) Field of Classification Search
CPC ..... G01R 1/203; G01R 15/08; G01R 19/0092
USPC ...................................................... 324/76.39
See application file for complete search history.

(56) References Cited

U.S. PATENT DOCUMENTS

| 2010/0231187 A1* | 9/2010 | Wicht | H02M 3/156 323/282 |
| 2013/0135047 A1* | 5/2013 | Danioni | H03F 3/45475 330/252 |
| 2019/0013750 A1* | 1/2019 | Leman | H02P 6/085 |
| 2021/0003615 A1* | 1/2021 | Sasaki | G01R 15/205 |

FOREIGN PATENT DOCUMENTS

| JP | 2010-170434 A | 8/2010 |
| JP | 2017-161409 A | 9/2017 |

* cited by examiner

*Primary Examiner* — Tung X Nguyen
*Assistant Examiner* — Robert P Alejnikov, Jr.
(74) *Attorney, Agent, or Firm* — Harness, Dickey & Pierce, P.L.C.

(57) ABSTRACT

A current detection circuit includes an operational amplifier, a current sense amplifier including a first resistor and a second resistor, and a level shifter. The first resistor is provided between one end of a shunt resistor and a first input node of the operational amplifier. The second resistor is provided between the other end of the shunt resistor and a second input node of the operational amplifier. The level shifter controls voltages of the first input node and the second input node by controlling, according to a voltage at the one end of the shunt resistor, currents supplied to the first input node and the second input node.

6 Claims, 7 Drawing Sheets

FIG. 3
PWM ON-Phase
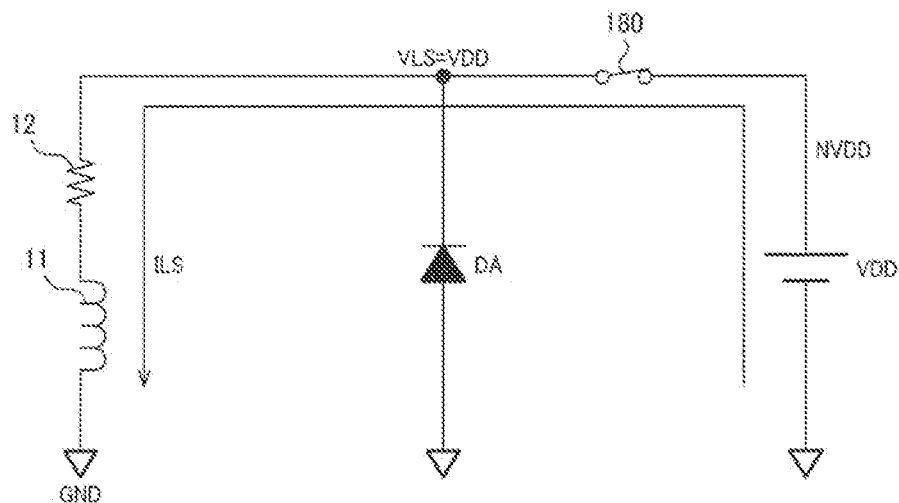
PWM OFF-Phase
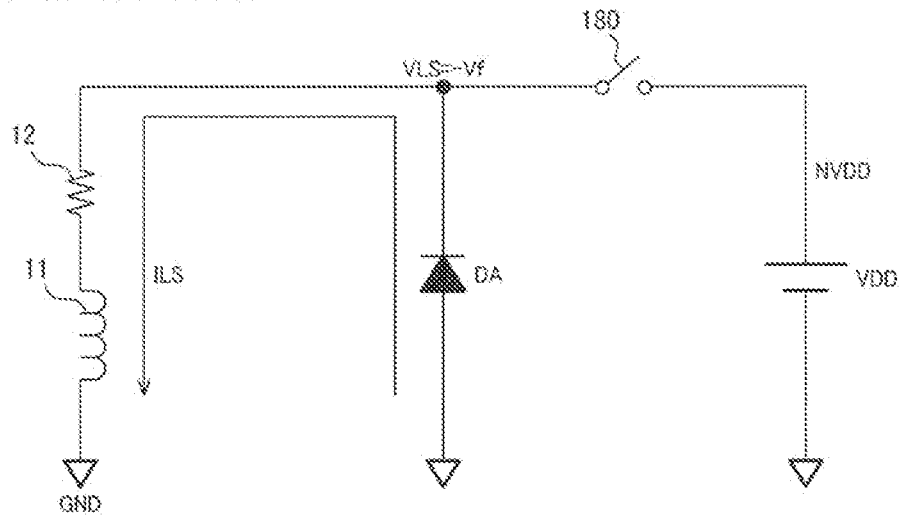

CURRENT DETECTION CIRCUIT, CIRCUIT DEVICE, AND SOLENOID CONTROL DEVICE

The present application is based on, and claims priority from JP Application Serial Number 2021-056395, filed Mar. 30, 2021, the disclosure of which is hereby incorporated by reference herein in its entirety.

BACKGROUND

1. Technical Field

The present disclosure relates to a current detection circuit, a circuit device, and a solenoid control device.

2. Related Art

US Unexamined Patent Application Publication No. 2013/0135047 discloses a current sense amplifier configured to detect a current flowing through a shunt resistor by detecting a potential difference between both terminals of the shunt resistor. The current sense amplifier in US Unexamined Patent Application Publication No. 2013/0135047 has a function of level-shifting a voltage of an input terminal, and includes a mode in which the voltage of the input terminal is level-shifted by flowing a current from the input terminal to outside of the amplifier, and a mode in which the voltage of the input terminal is level-shifted by flowing a current from the outside of the amplifier to the input terminal.

A signal input from the shunt resistor to the current sense amplifier includes the potential difference between both terminals of the shunt resistor and a common mode voltage, and the voltage of the input terminal of the current sense amplifier fluctuates depending on the common mode voltage. The current sense amplifier in US Unexamined Patent Application Publication No. 2013/0135047 lowers a range of voltage fluctuation at the input terminal by level-shifting the voltage of the input terminal. However, in a current sense amplifier circuit in US Patent Application Publication No. 2013/0135047, a level shift amount is constant because level shift is performed by a constant current using a current mirror. The common mode voltage in the shunt resistor may fluctuate due to, for example, voltage fluctuation of a power supply. Therefore, when the level shift amount is constant, there is a problem that the voltage of the input terminal of the current sense amplifier circuit fluctuates due to a fluctuation in the common mode voltage.

SUMMARY

One aspect of the present disclosure relates to a current detection circuit including: a current sense amplifier circuit configured to detect a current flowing through a shunt resistor among a switching element, the shunt resistor and an inductor coupled in series between a first power supply node and a second power supply node; and a level shift circuit. The current sense amplifier circuit includes an operational amplifier, a first resistor provided between a first resistor node at one end of the shunt resistor and a first input node of the operational amplifier, and a second resistor provided between a second resistor node at the other end of the shunt resistor and a second input node of the operational amplifier. The level shift circuit supplies a first current to the first input node of the operational amplifier and supplies a second current to the second input node of the operational amplifier, and level-shifts voltages of the first input node and the second input node of the operational amplifier by a variable level shift amount according to a voltage of the first resistor node by variably controlling the first current and the second current according to the voltage of the first resistor node.

In addition, another aspect of the present disclosure relates to a circuit device including the current detection circuit described above.

Further, yet another aspect of the present disclosure relates to a solenoid control device including the current detection circuit described above, the switching element, the shunt resistor, and a solenoid which is the inductor, in which the solenoid is controlled based on a current detection result output by the current sense amplifier circuit.

BRIEF DESCRIPTION OF THE DRAWINGS

FIG. 3 is a diagram illustrating a switching operation of PWM driving.

DESCRIPTION OF EXEMPLARY EMBODIMENTS

Hereinafter, a preferred embodiment of the present disclosure will be described in detail. The present embodiment to be described below does not unduly limit contents described in claims, and all configurations described in the present embodiment are not necessarily essential constituent elements.

1. Solenoid Control Device and Circuit Device

Figure 1:
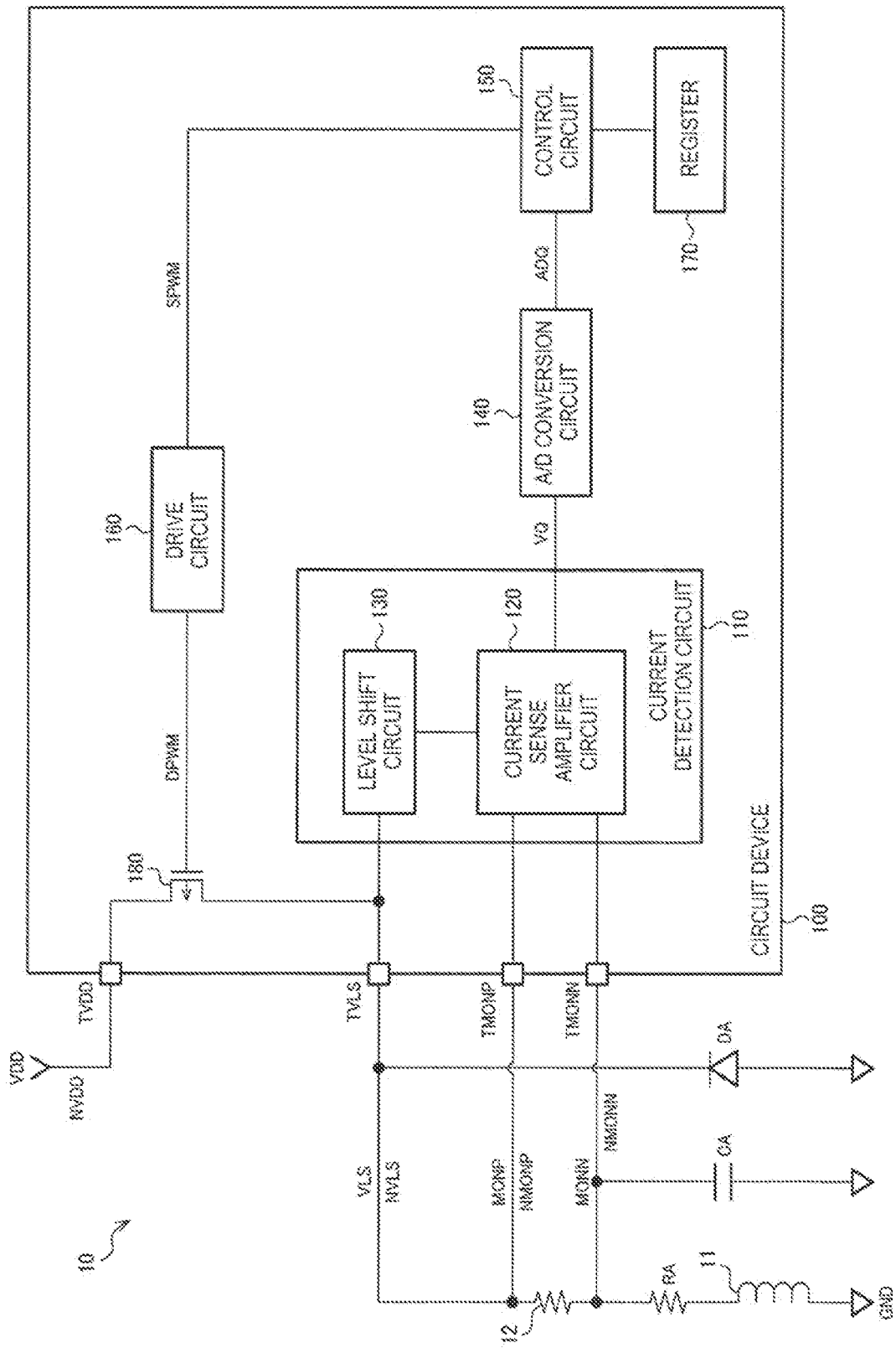
FIG. 1 is a configuration example of a solenoid control device and a circuit device.

FIG. 1 is a configuration example of a solenoid control device 10 and a circuit device 100 including a current detection circuit according to the present embodiment. Hereinafter, an example in which the current detection circuit according to the present embodiment is used for solenoid control will be described, but the current detection circuit according to the present embodiment is applicable to various devices configured to detect a current controlled by switching.

The solenoid control device 10 includes a shunt resistor 12, an inductor 11, a resistor RA, a capacitor CA, a diode DA, and the circuit device 100.

The inductor 11 is a coil of a solenoid. The solenoid includes the coil and a plunger that is movable along an axial direction of the coil. The plunger is also referred to as a movable iron core. A displacement amount of the plunger with respect to the coil is controlled by a current flowing through the coil.

The shunt resistor 12, the resistor RA, and the inductor 11 are coupled in series between a node NVLS and a ground node GND. Specifically, one end of the shunt resistor 12 is coupled to the node NVLS, and the other end thereof is coupled to one end of the resistor RA. The other end of the resistor RA is coupled to one end of the inductor 11. The other end of the inductor 11 is coupled to the ground node.

The diode DA is provided between the node NVLS and the ground node GND with a direction from the ground node GND to the node NVLS as a forward direction. Specifically, an anode of the diode DA is coupled to the ground node GND and a cathode is coupled to the node NVLS. The capacitor CA is provided in parallel with the resistor RA and the inductor 11. Specifically, one end of the capacitor CA is coupled to the one end of the resistor RA, and the other end thereof is coupled to the ground node GND.

The circuit device 100 detects a current flowing through the inductor 11 and controls the current flowing through the inductor 11 based on the detection result. The circuit device 100 includes a current detection circuit 110, an A/D conversion circuit 140, a control circuit 150, a drive circuit 160, a register 170, a switching element 180, and terminals TVDD, TVLS, TMONP and TMONN. The circuit device 100 is, for example, an integrated circuit device in which a plurality of circuit elements are integrated on a semiconductor substrate. Each terminal is, for example, a pad of the integrated circuit device or a terminal of a package accommodating the integrated circuit device. The switching element 180 may be provided outside the circuit device 100.

The switching element 180 is provided between a power supply node NVDD and the node NVLS. Specifically, the switching element 180 is a P-type transistor. A source of the P-type transistor is coupled to the terminal TVDD and a drain thereof is coupled to the terminal TVLS. The power supply node NVDD is coupled to the terminal TVDD, and a power supply voltage VDD is supplied from the outside of the circuit device 100. The node NVLS at the one end of the shunt resistor 12 is coupled to the terminal TVLS.

The current detection circuit 110 detects the current flowing through the inductor 11 by detecting a current flowing through the shunt resistor 12. The current detection circuit 110 includes a current sense amplifier circuit 120 and a level shift circuit 130.

A voltage MONP at the one end of the shunt resistor 12 is input to the current sense amplifier circuit 120 from a first resistor node NMONP via the terminal TMONP, and a voltage MONN at the other end of the shunt resistor 12 is input to the current sense amplifier circuit 120 from a second resistor node NMONN via the terminal TMONN. The first resistor node NMONP is a node coupled to the one end of the shunt resistor 12. The second resistor node NMONN is a node coupled to the other end of the shunt resistor 12. The current sense amplifier circuit 120 detects the current flowing through the shunt resistor 12 by detecting a potential difference between both terminals of the shunt resistor 12 based on the voltage MONP and the voltage MONN, and outputs a detected voltage VQ as a result. Two terminals TVLS and TMONP are coupled to the one end of the shunt resistor 12, and a node coupled to the terminal TVLS is referred to as a node NTVLS and a node coupled to the terminal TMOMP is referred to as a resistor node NMONP. Both a voltage VLS and the voltage MONP are voltages at the one end of the shunt resistor 12.

The level shift circuit 130 level-shifts a voltage of an input node of an operational amplifier included in the current sense amplifier circuit 120 by supplying a current to the input node of the operational amplifier. The level shift circuit 130 keeps the voltage of the input node of the operational amplifier constant by variably controlling the current supplied to the input node of the operational amplifier based on the voltage VLS at the one end of the shunt resistor 12. The details of the current sense amplifier circuit 120 and the level shift circuit 130 will be described later.

The A/D conversion circuit 140 A/D-converts the detected voltage VQ into detection data ADQ. Specifically, the A/D conversion circuit 140 performs A/D conversion at a sampling frequency higher than a switching frequency of the switching element 180, and acquires the detection data ADQ when the switching element 180 is turned on and the detection data ADQ when the switching element 180 is turned off.

The control circuit 150 outputs, based on the detection data ADQ, a PWM signal SPWM for PWM control of the switching element 180. Specifically, the register 170 stores a current set value of the current flowing through the inductor 11. The control circuit 150 smoothens the detection data ADQ to calculate a time average, and controls an on-duty of the switching element 180 such that the average value matches the current set value.

The drive circuit 160 outputs a PWM drive signal DPWM by buffering the PWM signal SPWM. The PWM drive signal DPWM is input to a gate of the P-type transistor, i.e., the switching element 180. The current flowing through the inductor 11 is controlled by the on-duty of the switching element 180.

2. First Detailed Configuration Example of Current Detection Circuit

Figure 2:
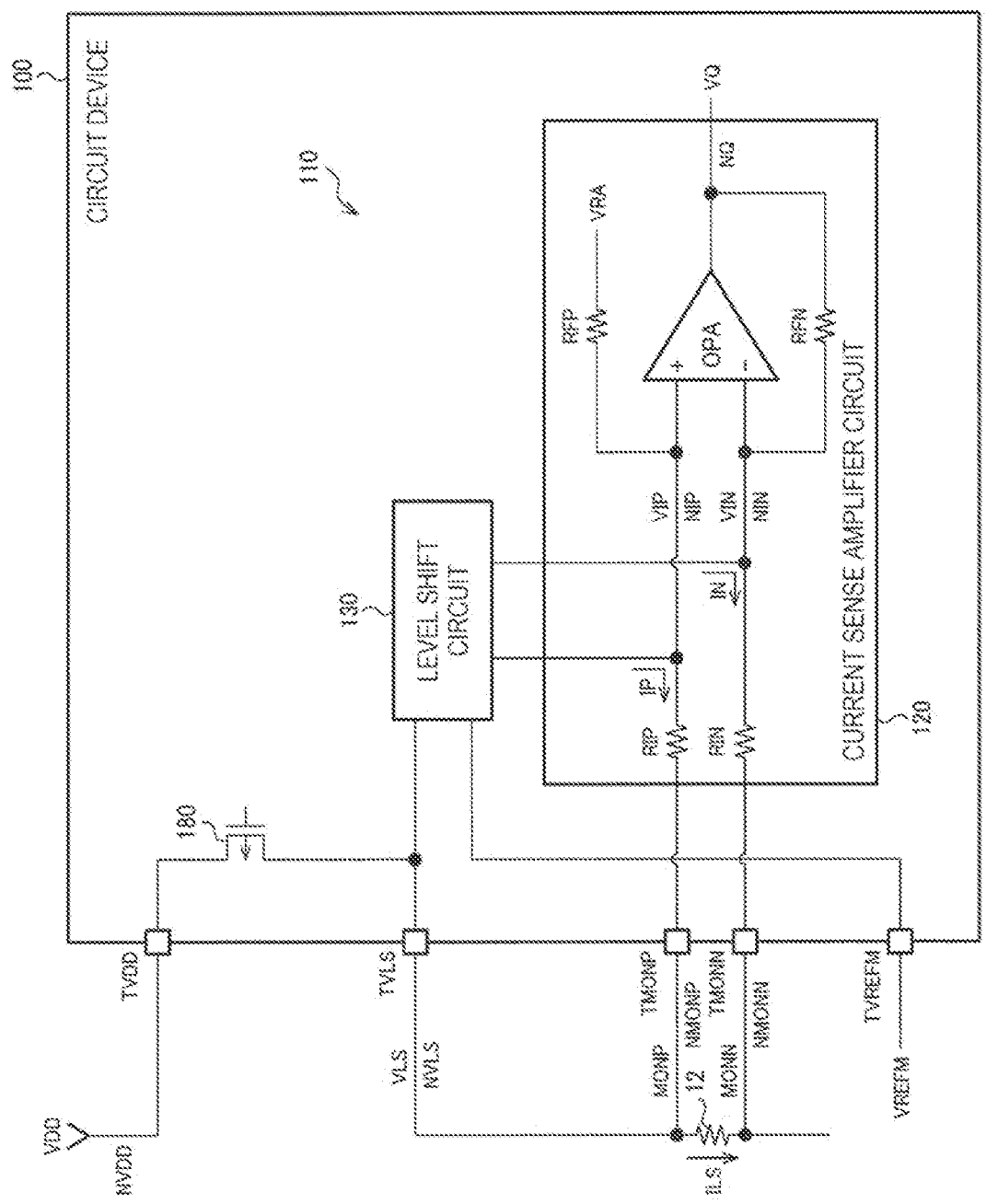
FIG. 2 is a first detailed configuration example of a current detection circuit.

FIG. 2 is a first detailed configuration example of the current detection circuit 110. FIG. 2 shows an example in which the circuit device 100 includes a terminal TVREFM, and a reference voltage VREFM is input to the terminal TVREFM from the outside of the circuit device 100, but the present disclosure is not limited to this, and a voltage generation circuit provided in the circuit device 100 may generate the reference voltage VREFM.

The current sense amplifier circuit 120 includes a first resistor RIP, a second resistor RIN, resistors RFP and RFN, and an operational amplifier OPA.

One end of the first resistor RIP is coupled to the terminal TMONP, and the other end thereof is coupled to a first input node NIP. One end of the resistor RFP is coupled to the first input node NIP, and an analog ground voltage VRA is input to the other end of the resistor RFP. The analog ground voltage VRA is input to the other end of the resistor RFP from a voltage generation circuit (not shown). One end of the second resistor RIN is coupled to the terminal TMONN and the other end thereof is coupled to a second input node NIN. One end of the resistor RFN is coupled to the second input node NIN and the other end thereof is coupled to an output node NQ of the operational amplifier OPA. The first input node NIP is a non-inverting input node of the operational amplifier OPA, and the second input node NIN is an inverting input node of the operational amplifier OPA. Resistance values of the first resistor RIP and the second resistor RIN are the same, and resistance values of the resistor RFP and the resistor RFN are the same. A gain of the current sense amplifier circuit 120 is, for example, several times to several tens of times, but is not limited to this.

The current flowing through the shunt resistor 12 is referred to as ILS, and a resistance value of the shunt resistor 12 is referred to as Rsh. In this case, a potential difference Vsh at both terminals of the shunt resistor 12 is given by the following equation (1), and the detected voltage VQ of the current sense amplifier circuit 120 is given by the following equation (2).

$$Vsh = MONP - MONN = Rsh \times ILS \qquad (1)$$

$$VQ = (RFP/RIP) \times Vsh \qquad (2)$$

The level shift circuit 130 causes a first current IP to flow through the first resistor RIP and causes a second current IN to flow through the second resistor RIN. When directions of arrows of IP and IN shown in FIG. 2 are positive directions of the currents, a level shift amount ΔVIP of a voltage VIP and a level shift amount ΔVIN of a voltage VIN are given by the following equation (3). VIP' and VIN' are voltages of input nodes of the operational amplifier OPA when the currents IP and IN do not flow.

$$\Delta VIP = VIP - VIP' = RIP \times IP,$$

$$\Delta VIN = VIN - VIN' = RIN \times IN \quad (3)$$

Since VIP'=VIN' and VIP=VIN due to virtual short, ΔVIP=ΔVIN. Since RIP=RIN, the level shift circuit 130 outputs a current IP=IN.

As shown in the following equation (4), the level shift circuit 130 outputs variable currents IP and IN according to a voltage VLS=MONP.

$$IP = IN = (VREFM - VLS)/RIP \quad (4)$$

Based on the above equations (3) and (4), the level shift amounts ΔVIP and ΔVIN are given by the following equation (5), and the voltages VIP and VIN of the input nodes of the operational amplifier OPA are given by the following equation (6).

$$\Delta VIP = \Delta VIN = VREFM - VLS \quad (5)$$

$$VIP = VIN = VIP' + \Delta VIP = VIP' - VLS + VREFM \quad (6)$$

When the gain of the current sense amplifier circuit 120 is sufficiently high, the voltage VIP' is substantially the same as the voltage VLS, so that the voltages VIP and VIN of the input nodes of the operational amplifier OPA are substantially the same as the reference voltage VREFM.

Hereinafter, a case where the level shift circuit 130 according to the present embodiment is not provided and a case where the level shift circuit 130 according to the present embodiment is provided will be compared. Firstly, the case where the level shift circuit 130 is not provided will be described.

FIG. 3 is a diagram illustrating a switching operation of PWM driving. In addition, FIG. 4 is a signal waveform diagram when the level shift circuit 130 is not provided.

As shown in the upper part of FIG. 3, when the switching element 180 is turned on, the current ILS flows from the power supply node NVDD to the ground node GND via the switching element 180, the shunt resistor 12, and the inductor 11. As shown in FIG. 4, the current ILS flowing through the inductor 11 gradually increases. In this case, the voltage at the one end of the shunt resistor 12 is VLS=VDD, and current detection in this case is referred to as high-side detection.

As shown in the lower part of FIG. 3, when the switching element 180 is turned off, the current ILS flows from a ground node GND to the ground node GND via the diode DA, the shunt resistor 12, and the inductor 11. As shown in FIG. 4, the current ILS flowing through the inductor 11 gradually decreases. In this case, the voltage at the one end of the shunt resistor 12 is VLS=−Vf, and current detection in this case is referred to as low-side detection. Vf is a forward voltage of the diode DA.

Figure 4:
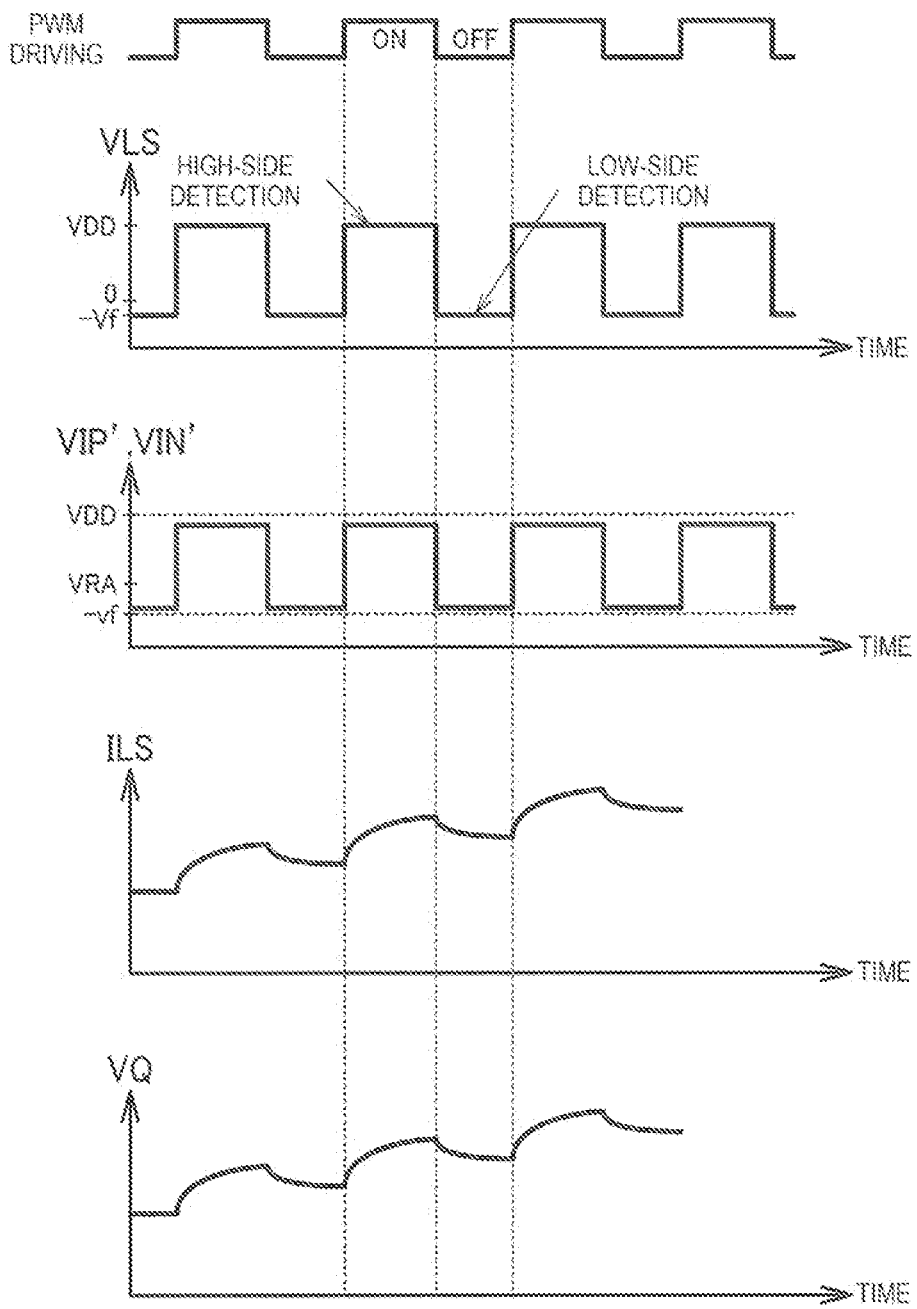
FIG. 4 is a signal waveform diagram when a level shift circuit is not provided.

As shown in FIG. 4, when the level shift circuit 130 is not provided, the voltage VIP' of the first input node NIP of the operational amplifier OPA is near the power supply voltage VDD in the high-side detection, and the voltage VIP' is a negative voltage near a ground voltage in the low-side detection. This voltage VIP' is a voltage divided, by the first resistor RIP and the resistor RFP, between the voltage MONP=VLS at the one end of the shunt resistor 12 and the analog ground voltage VRA. The voltage VIN' of the second input node NIN of the operational amplifier OPA is the same as the voltage VIP' due to the virtual short.

As described above, when the level shift circuit 130 is not provided, a voltage near the power supply voltage VDD and a negative voltage near the ground voltage are input to the input of the operational amplifier. Therefore, two current sense amplifiers for the high-side detection and the low-side detection are required, or when one current sense amplifier is used, an operational amplifier having a very wide input voltage range is required. In addition, when the power supply voltage VDD is high, it is necessary to implement the operational amplifier by a circuit element of a high withstand voltage process, which increases a layout area of the operational amplifier. Further, when a negative voltage is input to the operational amplifier, an influence such as turning on a parasitic diode in the operational amplifier may occur, and in order to avoid the influence, it is necessary to prepare a negative power supply.

Figure 5:
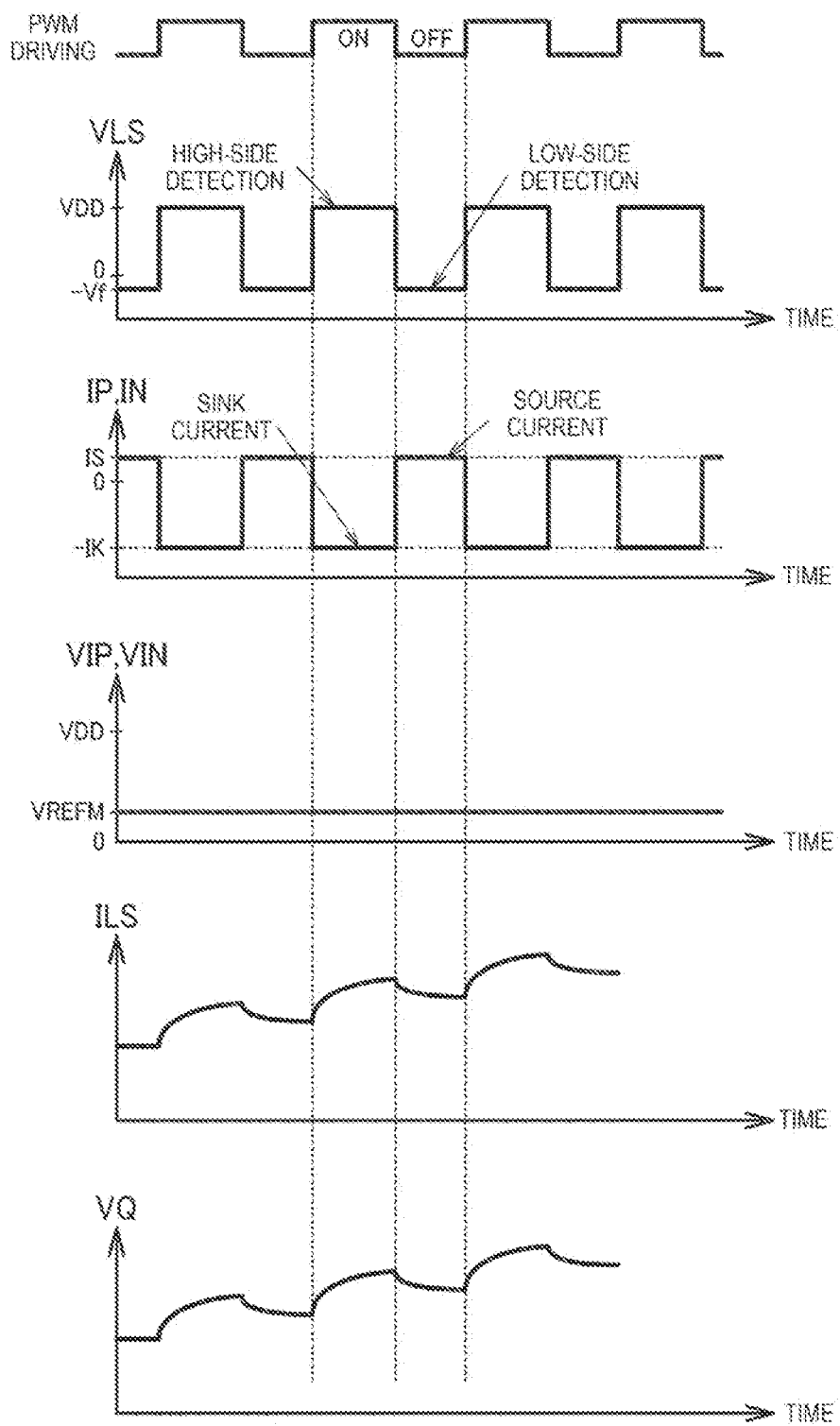
FIG. 5 is a signal waveform diagram when the level shift circuit is provided.

FIG. 5 is a signal waveform diagram when the level shift circuit 130 according to the present embodiment is provided. The switching operation in the PWM driving, a waveform of the voltage VLS, and a waveform of the current flowing through the inductor 11 are the same as those in FIG. 3 and FIG. 4.

When the level shift circuit 130 outputs a current to the first resistor RIP and the second resistor RIN, the current is referred to as a source current, and when the level shift circuit 130 draws a current from the first resistor RIP and the second resistor RIN, the current is referred to as a sink current.

As shown in FIG. 5, since VLS=VDD>VREFM in the high-side detection, the level shift circuit 130 causes IP=IN=−IK, which is a sink current, to flow. Based on the above equation (4), the sink current is given by the following equation (7).

$$IK = (VDD - VREFM)/RIP \quad (7)$$

In addition, based on the above equation (5), the level shift amount is given by the following equation (8). Since ΔVIP<0, the voltages VIP and VIN of the input nodes of the operational amplifier OPA are leveled down in the high-side detection.

$$\Delta VIP = \Delta VIN = VREFM - VDD \quad (8)$$

Since VLS=−Vf<VREFM in the low-side detection, the level shift circuit 130 causes IP=IN=IS, which is a source current, to flow. Based on the above equation (4), the sink current and the source current are given by the following equation (9).

$$IS = (VREFM + Vf)/RIP \quad (9)$$

In addition, based on the above equation (5), the level shift amount is given by the following equation (10). Since ΔVIP>0, the voltages VIP and VIN of the input nodes of the operational amplifier OPA are leveled up in the low-side detection.

$$\Delta VIP = \Delta VIN = VREFM + Vf \quad (10)$$

Due to the sink current in the above equation (7) and the source current in the above equation (9), the voltages VIP and VIN of the input nodes of the operational amplifier OPA are substantially the same as the reference voltage VREFM in both the high-side detection and the low-side detection. That is, in the high-side detection, the voltages VIP and VIN of the input nodes are leveled down from the power supply voltage VDD to a voltage substantially equal to the reference voltage VREFM, and in the low-side detection, the voltages VIP and VIN of the input nodes are leveled up from the negative voltage −Vf to the voltage substantially equal to the reference voltage VREFM. Accordingly, the high-side detection and the low-side detection can be performed in one current sense amplifier circuit, and an input voltage range of the operational amplifier of the current sense amplifier circuit may be a narrow range near the reference voltage VREFM. In addition, by setting the reference voltage VREFM to a voltage lower than a withstand voltage of a low withstand voltage process, the operational amplifier can be implemented by a circuit element of the low withstand voltage process.

Further, since the sink current IK in the above equation (7) is variably controlled according to the power supply voltage VDD, the sink current IK in the above equation (7) is controlled such that the voltages VIP and VIN of the input nodes of the operational amplifier OPA are substantially the same as the reference voltage VREFM even when the power supply voltage VDD fluctuates. This makes it possible to use various power supplies having different power supply voltages, and the voltages VIP and VIN of the input nodes of the operational amplifier OPA are kept constant with respect to the various power supply voltages. When a battery is used as the power supply, the power supply voltage decreases as a battery remaining amount decreases, but even when the power supply voltage decreases, the voltages VIP and VIN of the input nodes of the operational amplifier OPA are kept constant.

In the present embodiment described above, the switching element 180, the shunt resistor 12, and the inductor 11 are coupled in series between the first power supply node and the second power supply node. The current detection circuit 110 includes the current sense amplifier circuit 120 configured to detect the current ILS flowing through the shunt resistor 12, and the level shift circuit 130. The current sense amplifier circuit 120 includes the operational amplifier OPA, the first resistor RIP, and the second resistor RIN. The first resistor RIP is provided between the first resistor node NMONP at the one end of the shunt resistor 12 and the first input node NIP of the operational amplifier OPA. The second resistor RIN is provided between the second resistor node NMONN at the other end of the shunt resistor 12 and the second input node NIN of the operational amplifier OPA. The level shift circuit 130 supplies the first current IP to the first input node NIP of the operational amplifier OPA, and supplies the second current IN to the second input node NIN of the operational amplifier OPA. The level shift circuit 130 level-shifts the voltages VIP and VIN of the first input node NIP and the second input node NIN of the operational amplifier OPA by the variable level shift amount ΔVIP according to the voltage VLS of the first resistor node NMONP by variably controlling the first current IP and the second current IN according to the voltage VLS of the first resistor node NMONP.

According to the present embodiment, the level shift amount ΔVIP of the first input node NIP and the second input node NIN of the operational amplifier OPA can be variably controlled according to the voltage VLS of the first resistor node NMONP. Since the voltage VLS of the first resistor node NMONP and the common mode voltage are interlocked with each other, the level shift amount ΔVIP can be variably controlled according to the common mode voltage. Accordingly, even when the common mode voltage fluctuates due to a fluctuation in the power supply voltage VDD, fluctuations in the input voltages VIP and VIN of the operational amplifier OPA can be reduced as compared with a case where the level shift amount is constant.

In addition, in the present embodiment, when the switching element 180 is turned on, the level shift circuit 130 causes the first current IP=−IK to flow from the first resistor node NMONP to the first input node NIP of the operational amplifier OPA via the first resistor RIP, and causes the second current IN=−IK to flow from the second resistor node NMONN to the second input node NIN of the operational amplifier OPA via the second resistor RIN. When the switching element 180 is turned off, the level shift circuit 130 causes the first current IP=IS to flow from the first input node NIP of the operational amplifier OPA to the first resistor node NMONP via the first resistor RIP, and causes the second current IN=IS to flow from the second input node NIN of the operational amplifier OPA to the second resistor node NMONN via the second resistor RIN.

When the switching element 180 is turned on, the voltage MONP of the first resistor node NMONP is the power supply voltage VDD. In this high-side detection, the first input node NIP and the second input node NIN of the operational amplifier OPA are leveled down by causing the current to flow from a shunt resistor 12 side to an operational amplifier OPA side via the first resistor RIP and the second resistor RIN. When the switching element 180 is turned off, the voltage MONP of the first resistor node NMONP is −Vf. Vf is a forward voltage of a diode. In this low-side detection, the first input node NIP and the second input node NIN of the operational amplifier OPA are leveled up by causing the current to flow from the operational amplifier OPA side to the shunt resistor 12 side via the first resistor RIP and the second resistor RIN. By the above level down and level up, a difference between the input voltages VIP and VIN of the operational amplifier OPA in the high-side detection and the input voltages VIP and VIN of the operational amplifier OPA in the low-side detection can be reduced.

In the present embodiment, the level shift amount is a difference between the reference voltage VREFM and the voltage VLS of the first resistor node NMONP.

According to the present embodiment, the input voltages VIP and VIN of the operational amplifier OPA are level-shifted by a variable level shift amount according to the voltage VLS. Further, according to the present embodiment, the input voltages VIP and VIN of the operational amplifier OPA can be level-shifted to the voltage substantially equal to the reference voltage VREFM. Accordingly, even when the common mode voltage fluctuates due to the fluctuation in the power supply voltage VDD, the input voltages VIP and VIN of the operational amplifier OPA can be maintained at the voltage substantially equal to the reference voltage VREFM.

Figure 6:
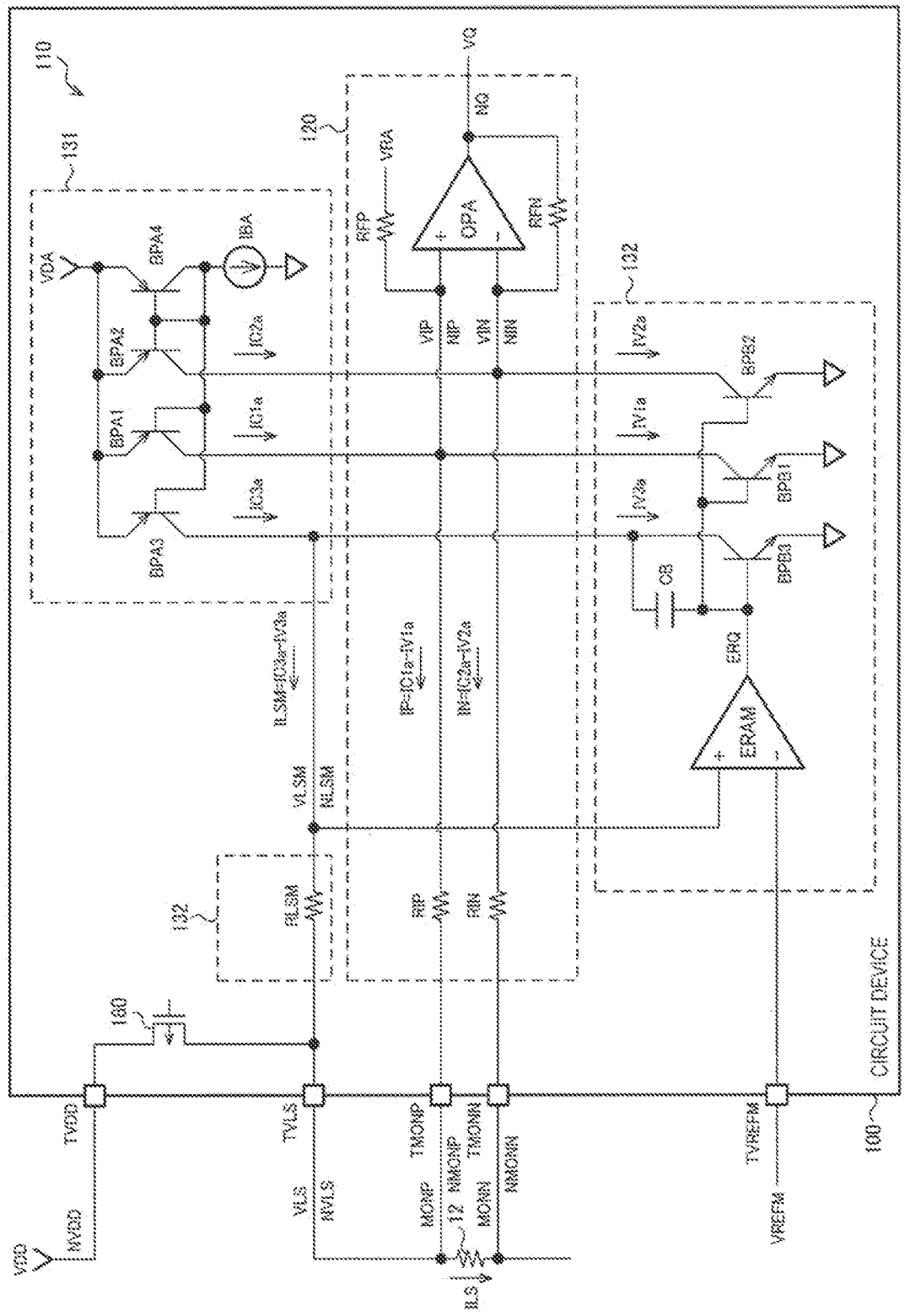
FIG. 6 is a second detailed configuration example of the current detection circuit.

3. Second Detailed Configuration Example and Third Detailed Configuration Example of Current Detection Circuit FIG. 6 is a second detailed configuration example of the current detection circuit 110. The current detection circuit 110 includes the current sense amplifier circuit 120, a source current source 131, and a variable sink current source 132. The source current source 131 and the variable sink current source 132 correspond to the level shift circuit 130. Since a configuration of the current sense amplifier circuit 120 is the same as that in FIG. 2, the description thereof will be omitted.

The source current source 131 includes PNP-type bipolar transistors BPA1 to BPA4 and a current source IBA.

Emitters of the bipolar transistors BPA1 to BPA4 are coupled to a node of a power supply voltage VDA. The power supply voltage VDA is supplied from, for example, a power supply circuit provided in the circuit device 100. A collector of the bipolar transistor BPA1 is coupled to the first input node NIP of the operational amplifier OPA, a collector of the bipolar transistor BPA2 is coupled to the second input node NIN of the operational amplifier OPA, and a collector of the bipolar transistor BPA3 is coupled to a node NLSM. Bases of the bipolar transistors BPA1 to BPA3 are coupled to a base and a collector of the bipolar transistor BPA4. A current to flow from the current source IBA is a current of the collector of the bipolar transistor BPA4, and the current of the collector is mirrored by the bipolar transistors BPA1 to BPA3 and constant currents IC1$a$ to IC3$a$ are output from the collector. The constant currents IC1$a$ to IC3$a$ are source currents, and IC1$a$=IC2$a$=IC3$a$.

The variable sink current source 132 includes a third resistor RLSM, an error amplifier circuit ERAM, NPN-type bipolar transistors BPB1 to BPB3, and a capacitor CB.

The third resistor RLSM is provided between the node NVLS and the node NLSM. Specifically, one end of the third resistor RLSM is coupled to the terminal TVLS, and the other end thereof is coupled to the node NLSM. RIP=RIN=RLSM.

The capacitor CB is provided between an output node of the error amplifier circuit ERAM and the node NLSM. Specifically, one end of the capacitor CB is coupled to the output node of the error amplifier circuit ERAM, and the other end thereof is coupled to the node NLSM.

Emitters of the bipolar transistors BPB1 to BPB3 are coupled to ground nodes. A collector of the bipolar transistor BPB1 is coupled to the first input node NIP of the operational amplifier OPA, a collector of the bipolar transistor BPB2 is coupled to the second input node NIN of the operational amplifier OPA, and a collector of the bipolar transistor BPB3 is coupled to the node NLSM.

The reference voltage VREFM is input from the terminal TVREFM to the inverting input node of the error amplifier circuit ERAM, a voltage VLSM of the node NVLS is input to the non-inverting input node, and the error amplifier circuit ERAM outputs a current control signal ERQ to the base of the bipolar transistor BPB3. When a current of the collector of the bipolar transistor BPB3 is a variable current IV3$a$, the error amplifier circuit ERAM feedback-controls the variable current IV3$a$ such that VLSM=VREFM. In this case, a current ILSM flowing through the third resistor RLSM by the level shift circuit 130 is given by the following equation (11).

$$ILSM=IC3a-IV3a=(VREFM-VLS)/RLSM \quad (11)$$

The current ILSM is a current corresponding to the voltage VLS at the one end of the shunt resistor 12. Since the IC3$a$ is a constant current, the variable current IV3$a$ is variably controlled according to the voltage VLS.

Currents of the collectors of the bipolar transistors BPB1 and BPB2 are variable currents IV1$a$ and IV2$a$. Since the current control signal ERQ is input from the error amplifier circuit ERAM to the bases of the bipolar transistors BPB1 and BPB2, IV1$a$=IV2$a$=IV3$a$. That is, the variable currents IV1$a$ and IV2$a$ are currents variably controlled according to the voltage VLS, similar to the variable current IV3$a$. The variable currents IV1$a$ to IV3$a$ are sink currents.

The current IP to flow through the first resistor RIP by the level shift circuit 130 and the current IN to flow through the second resistor RIN by the level shift circuit 130 are given by the following equation (12).

$$IP=IC1a-IV1a,$$

$$IN=IC2a-IV2a \quad (12)$$

Based on IC1$a$=IC2$a$=IC3$a$, IV1$a$=IV2$a$=IV3$a$ and the above equation (12), the currents IP and IN satisfy the following equation (13).

$$IP=IN=ILSM \quad (13)$$

Based on RIP=RIN=RLSM and the above equation (13), the level shift amounts $\Delta$VIP and $\Delta$VIN are given by the following equation (14).

$$\Delta VIP=\Delta VIN=RIP \times IP=RLSM \times ILSM \quad (14)$$

In the present embodiment described above, the level shift circuit 130 includes a first constant current source, a second constant current source, a first variable current source, a second variable current source, and a current control circuit. The first constant current source supplies the first constant current IC1$a$, which is a source current, to the first input node NIP of the operational amplifier OPA. The second constant current source supplies the second constant current IC2$a$, which is a source current, to the second input node NIN of the operational amplifier OPA. The first variable current source supplies the first variable current IV1$a$, which is a sink current, to the first input node NIP of the operational amplifier OPA. The second variable current source supplies the second variable current IV2$a$, which is a sink current, to the second input node NIN of the operational amplifier OPA. The current control circuit variably controls the first variable current IV1$a$ and the second variable current IV2$a$ according to the voltage VLS of the first resistor node NMONP.

In FIG. 6, the bipolar transistor BPA1 corresponds to the first constant current source, and the bipolar transistor BPA2 corresponds to the second constant current source. The bipolar transistor BPB1 corresponds to the first variable current source, and the bipolar transistor BPB2 corresponds to the second variable current source. The error amplifier circuit ERAM, the third resistor RLSM, and the bipolar transistors BPA3 and BPB3 correspond to the current control circuit.

According to the present embodiment, the first current IP is supplied to the first input node NIP of the operational amplifier OPA by the first constant current IC1$a$, which is a source current, and the first variable current IV1$a$, which is a sink current. The first current IP is variably controlled according to the voltage VLS of the first resistor node NMONP by variably controlling the first variable current IV1$a$ according to the voltage VLS of the first resistor node NMONP. In addition, the second current IN is supplied to the second input node NIN of the operational amplifier OPA by the second constant current IC2$a$, which is a source current, and the second variable current IV2$a$, which is a sink current. The second current IN is variably controlled according to the voltage VLS of the first resistor node NMONP by variably controlling a second variable current IV2$a$ according to the voltage VLS of the first resistor node NMONP. In the high-side detection, IC1$a$<IV1$a$ and IC2$a$<IV2$a$, and the first current IP and the second current IN are sink currents. In the low-side detection, IC1$a$>IV1$a$ and IC2$a$>IV2$a$, and the first current IP and the second current IN are source currents.

In addition, in the present embodiment, the current control circuit includes the error amplifier circuit ERAM, and the third resistor RLSM having one end coupled to the first resistor node NMONP. A first input node of the error amplifier circuit ERAM is coupled to the other end of the third resistor RLSM. The reference voltage VREFM is input to a second input node of the error amplifier circuit ERAM. The error amplifier circuit ERAM outputs, to the first variable current source and the second variable current source, the current control signal ERQ for controlling the first variable current IV1$a$ and the second variable current IV2$a$.

According to the present embodiment, by feedback control by the error amplifier circuit ERAM, the other end of the third resistor RLSM is the reference voltage VREFM, and the current ILSM corresponding to the difference between the voltage VLS of the first resistor node NMONP and the reference voltage VREFM flows through the third resistor RLSM. Then, by outputting the current control signal ERQ to the first variable current source and the second variable current source by the error amplifier circuit ERAM, the first variable current IV1$a$ and the second variable current IV2$a$ can be currents corresponding to the difference between the voltage VLS of the first resistor node NMONP and the reference voltage VREFM. Accordingly, the level shift amount ΔVIP is the difference between the voltage VLS of the first resistor node NMONP and the reference voltage VREFM.

Figure 7:
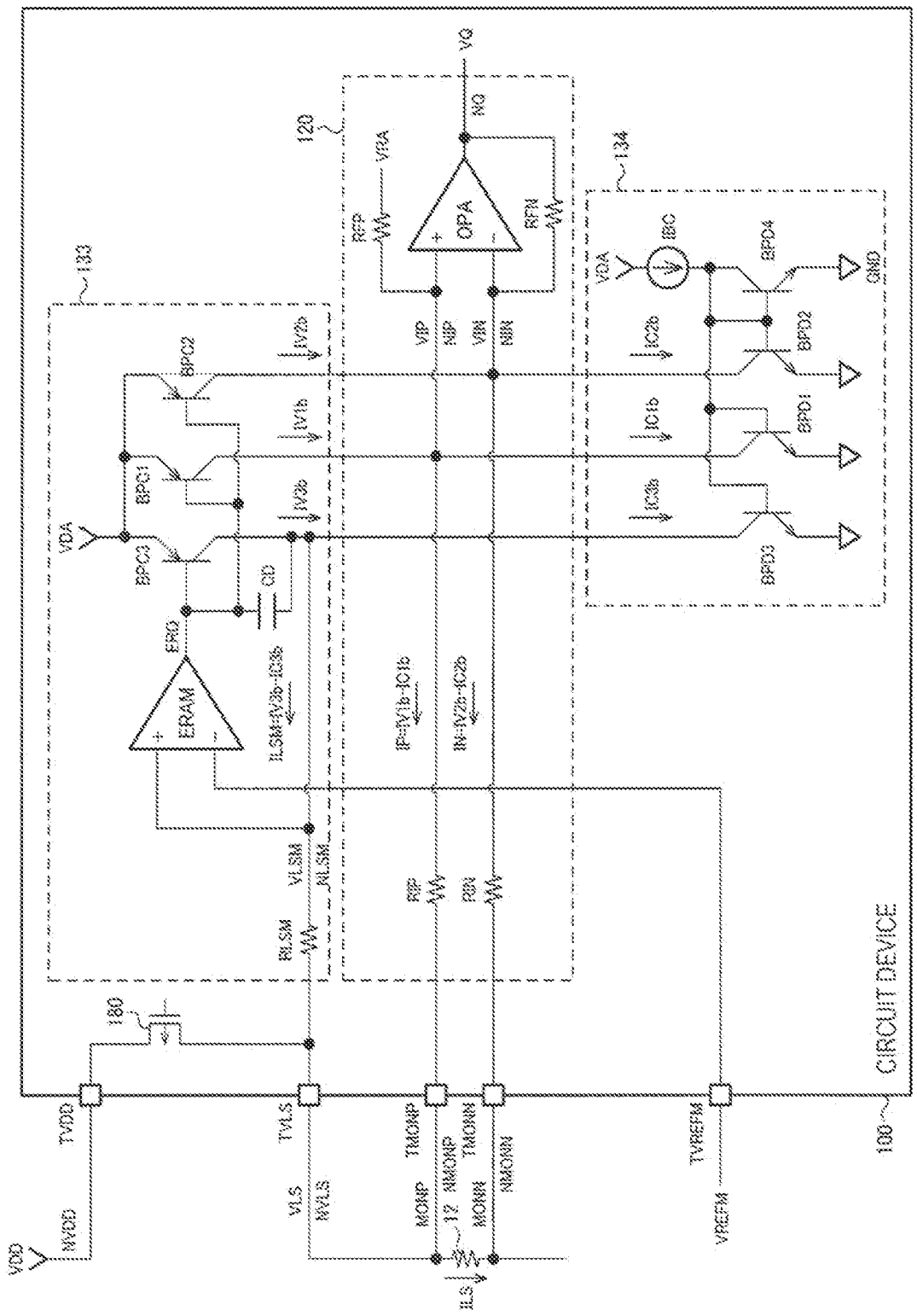
FIG. 7 is a third detailed configuration example of the current detection circuit.

FIG. 7 is a third detailed configuration example of the current detection circuit 110. The current detection circuit 110 includes the current sense amplifier circuit 120, a variable source current source 133, and a sink current source 134. The variable source current source 133 and the sink current source 134 correspond to the level shift circuit 130. Since a configuration of the current sense amplifier circuit 120 is the same as that in FIG. 2, the description thereof will be omitted.

The sink current source 134 includes NPN-type bipolar transistors BPD1 to BPD4 and a current source IBC.

Emitters of the bipolar transistors BPD1 to BPD4 are coupled to ground nodes GND. A collector of the bipolar transistor BPD1 is coupled to the first input node NIP of the operational amplifier OPA, a collector of the bipolar transistor BPD2 is coupled to the second input node NIN of the operational amplifier OPA, and a collector of the bipolar transistor BPD3 is coupled to the node NLSM. Bases of the bipolar transistors BPD1 to BPD3 are coupled to a base and a collector of the bipolar transistor BPD4. A current to flow from the current source IBC is a current of the collector of the bipolar transistor BPD4, and the current of the collector is mirrored by the bipolar transistors BPD1 to BPD3 and constant currents IC1$b$ to IC3$b$ flow through the collector. The constant currents IC1$b$ to IC3$b$ are sink currents, and IC1$b$=IC2$b$=IC3$b$.

The variable source current source 133 includes the third resistor RLSM, the error amplifier circuit ERAM, PNP-type bipolar transistors BPC1 to BPC3, and a capacitor CD.

The third resistor RLSM is provided between the node NVLS and the node NLSM. Specifically, one end of the third resistor RLSM is coupled to the terminal TVLS, and the other end thereof is coupled to the node NLSM. RIP=RIN=RLSM.

The capacitor CD is provided between the output node of the error amplifier circuit ERAM and the node NLSM. Specifically, one end of the capacitor CD is coupled to the output node of the error amplifier circuit ERAM, and the other end thereof is coupled to the node NLSM.

Emitters of the bipolar transistors BPC1 to BPC3 are coupled to the node of the power supply voltage VDA. A collector of the bipolar transistor BPC1 is coupled to the first input node NIP of the operational amplifier OPA, a collector of the bipolar transistor BPC2 is coupled to the second input node NIN of the operational amplifier OPA, and a collector of the bipolar transistor BPC3 is coupled to the node NLSM.

The reference voltage VREFM is input from the terminal TVREFM to the inverting input node of the error amplifier circuit ERAM, the voltage VLSM of the node NVLS is input to the non-inverting input node, and the error amplifier circuit ERAM outputs the current control signal ERQ to the base of the bipolar transistor BPC3. When a current of the collector of the bipolar transistor BPC3 is a variable current IV3$b$, the error amplifier circuit ERAM feedback-controls the variable current IV3$b$ such that VLSM=VREFM. In this case, the current ILSM flowing through the third resistor RLSM by the level shift circuit 130 is given by the following equation (15).

$$ILSM=IV3b-IC3b=(VREFM-VLS)/RLSM \qquad (15)$$

The current ILSM is a current corresponding to the voltage VLS at the one end of the shunt resistor 12. Since the IC3$b$ is a constant current, the variable current IV3$b$ is variably controlled according to the voltage VLS.

Currents of the collectors of the bipolar transistors BPC1 and BPC2 are variable currents IV1$b$ and IV2$b$. Since the current control signal ERQ is input from the error amplifier circuit ERAM to bases of the bipolar transistors BPC1 and BPC2, IV1$b$=IV2$b$=IV3$b$. That is, the variable currents IV1$b$ and IV2$b$ are currents variably controlled according to the voltage VLS, similar to the variable current IV3$b$. The variable currents IV1$b$ to IV3$b$ are source currents.

The current IP to flow through the first resistor RIP by the level shift circuit 130 and the current IN to flow through the second resistor RIN by the level shift circuit 130 are given by the following equation (16).

$$IP=IV1b-IC1b,$$
$$IN=IV2b-IC2b \qquad (16)$$

Based on IC1$b$=IC2$b$=IC3$b$, IV1$b$=IV2$b$=IV3$b$ and the above equation (16), the currents IP and IN satisfy the following equation (17).

$$IP=IN=ILSM \qquad (17)$$

Based on RIP=RIN=RLSM and the above equation (17), the level shift amounts ΔVIP and ΔVIN are given by the following equation (18).

$$\Delta VIP=\Delta VIN=RIP \times IP=RLSM \times ILSM \qquad (18)$$

In the present embodiment described above, the level shift circuit 130 includes a first variable current source, a second variable current source, a first constant current source, a second constant current source, and a current control circuit. The first variable current source supplies the first variable current IV1$b$, which is a source current, to the first input node NIP of the operational amplifier OPA. The second variable current source supplies the second variable current IV2$b$, which is a source current, to the second input node NIN of the operational amplifier OPA. The first constant current source supplies the first constant current IC1$b$, which is a sink current, to the first input node NIP of the operational amplifier OPA. The second constant current source supplies the second constant current IC2$b$, which is a sink current, to the second input node NIN of the operational amplifier OPA. The current control circuit variably controls the first variable current IV1$b$ and the second variable current IV2$b$ according to the voltage VLS of the first resistor node NMONP.

In FIG. 7, the bipolar transistor BPC1 corresponds to the first variable current source, and the bipolar transistor BPC2 corresponds to the second variable current source. The bipolar transistor BPD1 corresponds to the first constant current source, and the bipolar transistor BPD2 corresponds to the second constant current source. The error amplifier circuit ERAM, the third resistor RLSM, and the bipolar transistors BPC3 and BPD3 correspond to the current control circuit.

According to the present embodiment, the first current IP is supplied to the first input node NIP of the operational amplifier OPA by the first variable current IV1$b$, which is a source current, and the first constant current IC1$b$, which is a sink current. The first current IP is variably controlled according to the voltage VLS of the first resistor node NMONP by variably controlling the first variable current IV1$b$ according to the voltage VLS of the first resistor node NMONP. In addition, the second current IN is supplied to the second input node NIN of the operational amplifier OPA by the second variable current IV2$b$, which is a source current, and the second constant current IC2$b$, which is a sink current. The second current IN is variably controlled according to the voltage VLS of the first resistor node NMONP by variably controlling the second variable current IV2$b$ according to the voltage VLS of the first resistor node NMONP. In the high-side detection, IV1$b$<IC1$b$ and IV2$b$<IC2$b$, and the first current IP and the second current IN are sink currents. In the low-side detection, IV1$b$>IC1$b$ and IV2$b$>IC2$b$, and the first current IP and the second current IN are source currents.

The current detection circuit according to the present embodiment described above includes a current sense amplifier circuit and a level shift circuit. A switching element, a shunt resistor, and an inductor are coupled in series between a first power supply node and a second power supply node. The current sense amplifier circuit detects a current flowing through the shunt resistor. The current sense amplifier circuit includes an operational amplifier, a first resistor, and a second resistor. The first resistor is provided between a first resistor node at one end of the shunt resistor and a first input node of the operational amplifier. The second resistor is provided between a second resistor node at the other end of the shunt resistor and a second input node of the operational amplifier. The level shift circuit supplies a first current to the first input node of the operational amplifier, and supplies a second current to the second input node of the operational amplifier. The level shift circuit level-shifts voltages of the first input node and the second input node of the operational amplifier by a variable level shift amount according to a voltage of the first resistor node by variably controlling the first current and the second current according to the voltage of the first resistor node.

According to the present embodiment, level shift amounts of the first input node and the second input node of the operational amplifier can be variably controlled according to the voltage of the first resistor node. Since the voltage of the first resistor node and a common mode voltage are interlocked with each other, the level shift amount can be variably controlled according to the common mode voltage. Accordingly, even when the common mode voltage fluctuates due to a fluctuation in the power supply voltage, fluctuations in the input voltages of the operational amplifier can be reduced as compared with a case where the level shift amount is constant.

In the present embodiment, when the switching element is turned on, the level shift circuit may cause the first current to flow from the first resistor node to the first input node of the operational amplifier via the first resistor, and cause the second current to flow from the second resistor node to the second input node of the operational amplifier via the second resistor. When the switching element is turned off, the level shift circuit may cause the first current to flow from the first input node of the operational amplifier to the first resistor node via the first resistor, and cause the second current to flow from the second input node of the operational amplifier to the second resistor node via the second resistor.

In high-side detection in which the switching element is turned on, the first input node and the second input node of the operational amplifier are leveled down by causing the current to flow from a shunt resistor side to an operational amplifier side via the first resistor and the second resistor. In low-side detection in which the switching element is turned off, the first input node and the second input node of the operational amplifier are leveled up by causing the current to flow from the operational amplifier side to the shunt resistor side via the first resistor and the second resistor. By the above level down and level up, a difference between the input voltages of the operational amplifier in the high-side detection and the input voltages of the operational amplifier in the low-side detection can be reduced.

In the present embodiment, the level shift amount may be a difference between the reference voltage and the voltage of the first resistor node.

According to the present embodiment, the input voltages of the operational amplifier are level-shifted by a variable level shift amount according to a voltage at the one end of the shunt resistor. Further, according to the present embodiment, the input voltages of the operational amplifier can be level-shifted to a voltage substantially equal to the reference voltage. Accordingly, even when the common mode voltage fluctuates due to the fluctuation in the power supply voltage, the input voltages of the operational amplifier can be maintained at the voltage substantially equal to the reference voltage.

In the present embodiment, the level shift circuit may include a first constant current source, a second constant current source, a first variable current source, a second variable current source, and a current control circuit. The first constant current source may supply a first constant current, which is a source current, to the first input node of the operational amplifier. The second constant current source may supply a second constant current, which is a source current, to the second input node of the operational amplifier. The first variable current source may supply a first variable current, which is a sink current, to the first input node of the operational amplifier. The second variable current source may supply a second variable current, which is a sink current, to the second input node of the operational amplifier. The current control circuit may variably control the first variable current and the second variable current according to the voltage of the first resistor node.

According to the present embodiment, the first current is supplied to the first input node of the operational amplifier by the first constant current, which is a source current, and the first variable current, which is a sink current. The first current is variably controlled according to the voltage of the first resistor node by variably controlling the first variable current according to the voltage of the first resistor node. In addition, the second current is supplied to the second input node of the operational amplifier by the second constant current, which is a source current, and the second variable current, which is a sink current. The second current is variably controlled according to the voltage of the first resistor node by variably controlling the second variable current according to the voltage of the first resistor node.

In the present embodiment, the level shift circuit may include a first variable current source, a second variable current source, a first constant current source, a second constant current source, and a current control circuit. The first variable current source may supply a first variable current, which is a source current, to the first input node of the operational amplifier. The second variable current source may supply a second variable current, which is a source current, to the second input node of the operational amplifier. The first constant current source may supply a first constant current, which is a sink current, to the first input node of the operational amplifier. The second constant current source may supply a second constant current, which is a sink current, to the second input node of the operational amplifier. The current control circuit may variably control the first variable current and the second variable current according to the voltage of the first resistor node.

According to the present embodiment, the first current is supplied to the first input node of the operational amplifier by the first variable current, which is a source current, and the first constant current, which is a sink current. The first current is variably controlled according to the voltage of the first resistor node by variably controlling the first variable current according to the voltage of the first resistor node. In addition, the second current is supplied to the second input node of the operational amplifier by the second variable current, which is a source current, and the second constant current, which is a sink current. The second current is variably controlled according to the voltage of the first resistor node by variably controlling the second variable current according to the voltage of the first resistor node.

In the present embodiment, the current control circuit may include an error amplifier circuit, and a third resistor having one end coupled to the first resistor node. A first input node of the error amplifier circuit may be coupled to the other end of the third resistor, and the reference voltage may be input to a second input node of the error amplifier circuit. The error amplifier circuit may output, to the first variable current source and the second variable current source, a current control signal for controlling the first variable current and the second variable current.

According to the present embodiment, by feedback control by the error amplifier circuit, the other end of the third resistor is the reference voltage, and a current corresponding to a difference between the voltage of the first resistor node and the reference voltage flows through the third resistor. Then, by outputting the current control signal to the first variable current source and the second variable current source by the error amplifier circuit, the first variable current and the second variable current can be currents corresponding to the difference between the voltage of the first resistor node and the reference voltage. Accordingly, the level shift amount is the difference between the voltage of the first resistor node and the reference voltage.

A circuit device according to the present embodiment includes any one of the current detection circuits described above.

The circuit device according to the present embodiment may include any one of the current detection circuits described above, and a terminal to which the reference voltage is input.

A solenoid control device according to the present embodiment includes any one of the current detection circuits described above, the switching element, the shunt resistor, and a solenoid which is the inductor. The solenoid control device controls the solenoid based on a current detection result output by the current sense amplifier circuit.

Although the present embodiment has been described in detail above, it will be easily understood by those skilled in the art that many modifications can be made without substantially departing from the novel matters and effects of the present disclosure. Therefore, all such modifications are intended to be included within the scope of the present disclosure. For example, a term cited with a different term having a broader meaning or the same meaning at least once in the specification or in the drawings can be replaced with the different term in any place in the specification or in the drawings. In addition, all combinations of the present embodiment and the modifications are also included in the scope of the present disclosure. Further, the configurations and operations of the current sense amplifier circuit, the level shift circuit, the current detection circuit, the inductor, the circuit device and the solenoid control device are not limited to those described in the present embodiment, and various modifications can be made.

What is claimed is:
1. A current detection circuit comprising:
a current sense amplifier circuit configured to detect a current flowing through a shunt resistor among a switching element, the shunt resistor and an inductor coupled in series between a first power supply node and a second power supply node; and
a level shift circuit, wherein
the current sense amplifier circuit includes
an operational amplifier,
a first resistor provided between a first resistor node at one end of the shunt resistor and a first input node of the operational amplifier, and
a second resistor provided between a second resistor node at the other end of the shunt resistor and a second input node of the operational amplifier, and
wherein the level shift circuit is configured to supply a first current to the first input node of the operational amplifier and supply a second current to the second input node of the operational amplifier, and
level-shift voltages of the first input node and the second input node of the operational amplifier by a variable level shift amount according to a voltage of the first resistor node by variably controlling the first current and the second current according to the voltage of the first resistor node.

2. The current detection circuit according to claim 1, wherein
the level shift circuit is configured to
when the switching element is turned on, cause the first current to flow from the first resistor node to the first input node of the operational amplifier via the first resistor, and cause the second current to flow from the second resistor node to the second input node of the operational amplifier via the second resistor, and
when the switching element is turned off, cause the first current to flow from the first input node of the operational amplifier to the first resistor node via the first resistor, and cause the second current to flow from the second input node of the operational amplifier to the second resistor node via the second resistor.

3. The current detection circuit according to claim 1, wherein
the level shift amount is a difference between a reference voltage and the voltage of the first resistor node.

4. The current detection circuit according to claim 1, wherein
the level shift circuit includes
a first constant current source configured to supply a first constant current, which is a source current, to the first input node of the operational amplifier, a second constant current source configured to supply a second constant current, which is a source current, to the second input node of the operational amplifier, a first variable current source configured to supply a first variable current, which is a sink current, to the first input node of the operational amplifier, a second variable current source configured to supply a second variable current, which is a sink current, to the second input node of the operational amplifier, and a current control circuit configured to variably control the first variable current and the second variable current according to the voltage of the first resistor node.

5. The current detection circuit according to claim 4, wherein the current control circuit includes
a third resistor having one end coupled to the first resistor node, and
an error amplifier circuit, a first input node of the error amplifier circuit is coupled to the other end of the third resistor, and the reference voltage is input to a second input node of the error amplifier circuit, and the error amplifier circuit outputs, to the first variable current source and the second variable current source, a current control signal for controlling the first variable current and the second variable current.

6. The current detection circuit according to claim 1, wherein the level shift circuit includes
a first variable current source configured to supply a first variable current, which is a source current, to the first input node of the operational amplifier, a second variable current source configured to supply a second variable current, which is a source current, to the second input node of the operational amplifier, a first constant current source configured to supply a first constant current, which is a sink current, to the first input node of the operational amplifier, a second constant current source configured to supply a second constant current, which is a sink current, to the second input node of the operational amplifier, and a current control circuit configured to variably control the first variable current and the second variable current according to the voltage of the first resistor node.

* * * * *